United States Patent
Bechtel et al.

(10) Patent No.: US 10,658,552 B2
(45) Date of Patent: May 19, 2020

(54) BLUE EMITTING PHOSPHOR CONVERTED LED WITH BLUE PIGMENT

(71) Applicant: KONINKLIJKE PHILIPS N.V., Eindhoven (NL)

(72) Inventors: Hans-Helmut Bechtel, Aachen (DE); Thomas Diederich, Aachen (DE); Erik Maria Roeling, Aachen (DE); Marinus Johannes Petrus Maria van Gerwen, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 81 days.

(21) Appl. No.: 15/556,579

(22) PCT Filed: Mar. 16, 2016

(86) PCT No.: PCT/EP2016/055669
§ 371 (c)(1),
(2) Date: Sep. 7, 2017

(87) PCT Pub. No.: WO2016/150789
PCT Pub. Date: Sep. 29, 2016

(65) Prior Publication Data
US 2018/0062050 A1  Mar. 1, 2018

(30) Foreign Application Priority Data

Mar. 24, 2015  (EP) .................................... 15160458

(51) Int. Cl.
*H01L 33/50* (2010.01)
*C09K 11/77* (2006.01)
(Continued)

(52) U.S. Cl.
CPC ........ *H01L 33/504* (2013.01); *C09K 11/7774* (2013.01); *F21K 9/60* (2016.08);
(Continued)

(58) Field of Classification Search
CPC .. F21K 9/60; F21W 2111/00; F21W 2121/00; F21Y 2115/10; H01L 2933/0041; H01L 33/504; H01L 33/507
See application file for complete search history.

(56) References Cited

U.S. PATENT DOCUMENTS 5,277,841 A    1/1994  Jeong et al.
6,613,247 B1 *  9/2003  Hohn ................. C09K 11/7774
                                                          252/301.36
(Continued)

FOREIGN PATENT DOCUMENTS

CN    1761835 A     4/2006
CN    101438425 B   4/2011
(Continued)

OTHER PUBLICATIONS

EPO as ISA, "Partial International Search Report" dated Jun. 2, 2016 from International Application No. PCT/EP2016/055669, filed Mar. 16, 2016, 12 pages.
(Continued)

*Primary Examiner* — Tsion Tumebo (57) ABSTRACT

The invention provides an LED package configured to generate blue LED package light, wherein the LED package comprises a solid state light source configured to generate blue light source light, a luminescent material configured to convert part of the light source light into luminescent material light comprising green light, and a blue pigment configured to absorb part of the luminescent material light.

13 Claims, 4 Drawing Sheets

(51) Int. Cl.
| | |
|---|---|
| *F21K 9/60* | (2016.01) |
| *F21Y 115/10* | (2016.01) |
| *F21V 23/00* | (2015.01) |
| *F21W 111/00* | (2006.01) |
| *F21W 121/00* | (2006.01) |

(52) U.S. Cl.
CPC ......... *F21V 23/003* (2013.01); *F21W 2111/00* (2013.01); *F21W 2121/00* (2013.01); *F21Y 2115/10* (2016.08); *H01L 33/507* (2013.01); *H01L 2933/0041* (2013.01)

(56) References Cited

U.S. PATENT DOCUMENTS

| | | | |
|---|---|---|---|
| 6,809,347 B2 | 10/2004 | Tasch et al. | |
| 7,183,010 B2* | 2/2007 | Jarikov | C09K 11/06 313/504 |
| 9,219,201 B1* | 12/2015 | Todorov | H01L 33/502 |
| 2005/0093146 A1 | 5/2005 | Sakano | |
| 2008/0057342 A1* | 3/2008 | Sekiya | B82Y 20/00 428/690 |
| 2009/0033201 A1* | 2/2009 | Shimooka | C09K 11/0883 313/483 |
| 2009/0167151 A1 | 7/2009 | Kolodin et al. | |
| 2011/0291132 A1 | 12/2011 | Liu et al. | |
| 2011/0303940 A1* | 12/2011 | Lee | H01L 33/54 257/98 |
| 2012/0256533 A1* | 10/2012 | Seto | C04B 35/58085 313/498 |
| 2013/0082589 A1* | 4/2013 | So | H01L 51/5036 313/504 |
| 2013/0300282 A1* | 11/2013 | Mori | H01L 33/504 313/503 |
| 2014/0167601 A1* | 6/2014 | Harry | C09K 11/0883 313/503 |
| 2014/0312376 A1* | 10/2014 | Wilcox | H01L 33/504 257/98 |
| 2015/0060922 A1* | 3/2015 | Wilcox | H01L 33/504 257/98 |
| 2015/0069430 A1 | 3/2015 | Collins et al. | |
| 2015/0123155 A1* | 5/2015 | Schmidt | C09K 11/0883 257/98 |
| 2015/0131259 A1* | 5/2015 | Ouderkirk | H01L 25/0753 362/84 |
| 2015/0228868 A1* | 8/2015 | Ouderkirck | H01L 25/0753 362/84 |
| 2016/0085090 A1* | 3/2016 | Harding | G02B 1/041 351/159.6 |
| 2016/0087162 A1* | 3/2016 | Yao | H01L 33/504 257/98 |
| 2016/0254421 A1* | 9/2016 | Reiherzer | H01L 33/504 257/89 |

FOREIGN PATENT DOCUMENTS

| | | |
|---|---|---|
| CN | 103329293 A | 9/2013 |
| EP | 2736086 A2 | 5/2014 |
| JP | 2000276920 A | 10/2000 |
| JP | 2005159311 A | 6/2005 |
| JP | 2005303289 A | 10/2005 |
| JP | 2007226053 A | 9/2007 |
| JP | 2009193995 A | 8/2009 |
| JP | 2009535834 A | 10/2009 |
| JP | 2014210684 A | 11/2014 |
| KR | 1020140067281 A | 6/2014 |
| TW | 200809140 A | 2/2008 |
| TW | 200818977 A | 4/2008 |
| WO | 02054502 A1 | 7/2002 |
| WO | 2004084261 A2 | 9/2004 |
| WO | 2007125493 A2 | 11/2007 |
| WO | 2009042252 A1 | 4/2009 |

OTHER PUBLICATIONS

Extended European Search Report dated Sep. 2, 2015 from European Patent Application No. 15160458.4 filed Mar. 24, 2015, 6 pages.
TW 105109290, "Office Action," dated Nov. 18, 2019, 11 pages.
JP App. No. 2017-549403, "First Office Action," dated Feb. 18, 2020, 11 pages.
Lai et al., "Phosphor-Saving and Excellent Color-Rendering Index Candlelight LEDs Containing Composite Photonic Crystals," Conference on Lasers and Electro-Optics, 2014.

* cited by examiner

BLUE EMITTING PHOSPHOR CONVERTED LED WITH BLUE PIGMENT

CROSS-REFERENCE TO RELATED APPLICATIONS

The present application is a § 371 application of International Application No. PCT/EP2016/055669 filed on Mar. 16, 2016 and titled "BLUE EMITTING PHOSPHOR CONVERTED LED WITH BLUE PIGMENT," which claims the benefit of European Patent Application No. 15160458.4 filed on Mar. 24, 2015. International Application No. PCT/EP2016/055669 and European Patent Application No. 15160458.4 are incorporated herein.

FIELD OF THE INVENTION

The invention relates to an LED package as well as to a lighting device comprising such LED package. The invention further relates to the use of such LED package and/or lighting device in specific lighting applications.

BACKGROUND OF THE INVENTION

The use of signal lighting is known in the art. WO2009042252, for instance, describes an LED signal lamp comprising a housing, at least one LED excitation source operable to emit excitation radiation of a first wavelength range (blue light), at least one phosphor material for converting at least a part of the excitation radiation to radiation of a second wavelength range and a substantially transparent cover provided on the housing opening. In one arrangement the excitation source (LED chip) incorporates the phosphor material. Alternatively, the phosphor can be provided remote to the excitation source such as for example on a transparent substrate which is disposed between the excitation source and transparent cover. In other arrangements of WO2009042252, the phosphor is provided on the transparent cover. In yet other arrangements, the phosphor is provided on the transparent cover of other special optical components as a layer on a surface of the cover or incorporated within the cover/optical component material.

WO2007125493 describes a light-emitting device, comprising at least one light-emitting diode for emitting light of a first color and a luminescent material arranged on said at least one light-emitting diode to receive at least part of the light emitted by said light-emitting diode. The light-emitting device further comprises a filter arranged to receive light emitted by said light-emitting diode and transmitted through said luminescent material and to absorb light of said first color. The filter comprises a pigment compound distributed in a matrix of silicon and oxygen atoms, in which matrix at least a portion of said silicon atoms are directly bonded to hydrocarbon groups.

EP2736086 describes a semiconductor device, and a light emitting device package usable with a lighting apparatus is disclosed. The light emitting device package comprises a package body, a light emitting device located on the package body, the light emitting device emitting light having a first wavelength band, a transparent substrate located over the light emitting device with a distance therebetween, a wavelength conversion layer located on the transparent substrate, wherein the wavelength conversion layer absorbs and converts at least a part of the light having the first wavelength band into light having a second wavelength band, and a color calibration layer located on the wavelength conversion layer, the color calibration layer calibrating color of the wavelength conversion layer.

U.S. Pat. No. 5,277,841 describes a mixed blue emitting phosphor which is obtained by mixing ZnS:Ag,Al with at least one green emitting phosphor selected from the group consisting of $Y_3(Al,Ga)_5O_{12}$:Tb, $Y_2SiO_5$:Tb and LaOCl:Tb of an amount below 20 wt. %, thereby greatly enhancing luminance and luminance-saturation characteristic.

US2011291132 describes a light-emitting device (LED). The LED includes a carrier substrate having a blue light emitter thereon. A layer containing a fluorescent material is on the blue light emitter. An encapsulant is disposed around the blue light emitter. Pigments are suspended between an outer surface of the encapsulant and the blue light emitter.

US2009167151 describes a lighting device, a backlighting device, and a display device that comprise a radiation source such as LED and wavelength converting members comprising phosphors. In one embodiment, self-absorption within the devices is suppressed or reduced by placing a selective reflector between two wavelength converting members, and the wavelength converting member emitting light with longer peak wavelength is substantially isolated from the irradiation of another wavelength converting member emitting light with shorter peak wavelength. In other embodiments, the wavelength converting members are arranged in strip configuration; or in adjacent hexagons configuration.

SUMMARY OF THE INVENTION

There is a desire to increase the luminous flux of blue light emitting light sources, especially for specific lighting applications. It appeared that the flux of blue emitting LEDs for blue light signaling applications can already be increased by adding a thin layer of green emitting phosphors on an InGaN blue LED. However, there is a desire to further improve the luminous flux. The terms "luminous flux" or "luminous power" describe a measure of the perceived power of light (i.e. perceived by a human), as known in the art. Instead of the term "phosphor" also the term "luminescent material" may be applied.

Hence, it is an aspect of the invention to provide an alternative light source and/or lighting device comprising such light source, which preferably further at least partly obviate one or more of above-described drawbacks, and which may especially have an even higher luminous flux, while still providing blue light.

It surprisingly appeared that a specific combination of a blue light source, a green luminescent material and a blue pigment provides very good results. This invention describes amongst others the addition of blue pigments to the phosphor layer to increase the flux while maintaining a saturated blue emission and staying within a desired chromaticity zone for saturated blue colors. For a given combination of blue peak wavelength and green phosphor a flux gain of more than 20 percent has been achieved. The invention can be used for amongst others pcLEDs (phosphor converted LEDs) in blue emergency and/or decorative lighting applications.

In a first aspect, the invention provides an LED package configured to generate blue LED package light, wherein the LED package comprises a (solid state) light source configured to generate blue light source light, a luminescent material configured to convert part of the light source light into luminescent material light comprising green light, and a blue pigment configured to absorb part of the luminescent material light.

It surprisingly appears that with such LED package a relatively high luminous flux may be achieved for blue light. The color of the light can be tuned to CIE coordinates in the most efficient part of the CIE diagram that describes the required blue color, such as e.g. defined by CIE S 004/E-2001 and/or DIN 6163-4:2011-07. Hence, in an embodiment especially such LED package, or a lighting device comprising such LED package, may especially be used for providing blue emergency lighting or for providing decorative lighting.

Especially, the light source is a solid state light source that during operation emits (light source light) at least light at a wavelength selected from the range of 400-490 nm, especially a light source that during operation emits at least light at wavelength selected from the range of 420-490 nm, even more especially in the range of 440-490 nm. Even more especially, the (solid state) light source is configured to generate blue light source light having a peak wavelength (i.e. the maximum of the emission) in the range of 450-465 nm. Hence, in a specific embodiment, the light source is configured to generate blue light. In a specific embodiment, the light source comprises a solid state light source (such as an LED or laser diode). The term "light source" may also relate to a plurality of light sources, such as 2-20 (solid state) LED light sources. Hence, the term LED may also refer to a plurality of LEDs. Whatever configuration is selected, directly downstream from the LED package the light emanating from the LED package is especially blue light. This blue light may comprise minor contributions in e.g. one or more of the UV, green, yellow, orange, and red, but the spectral distribution of the LED package light is such, that it is blue light. Hence, the dominant wavelength of the LED package light is especially in the range of 450-470 nm. In embodiments, instead of the term "LED package" also the term "laser package" may be applied, especially in embodiments wherein the solid state light source comprises a laser. Hence, in general the term "light source package" may be used.

The terms "upstream" and "downstream" relate to an arrangement of items or features relative to the propagation of the light from a light generating means (here especially the (solid state) light source), wherein relative to a first position within a beam of light from the light generating means, a second position in the beam of light closer to the light generating means is "upstream", and a third position within the beam of light further away from the light generating means is "downstream".

The terms "violet light" or "violet emission" especially relates to light having a wavelength in the range of about 380-440 nm. The terms "blue light" or "blue emission" especially relates to light having a wavelength in the range of about 440-495 nm (including some violet and cyan hues). The terms "green light" or "green emission" especially relate to light having a wavelength in the range of about 495-570 nm. The terms "yellow light" or "yellow emission" especially relate to light having a wavelength in the range of about 570-590 nm. The terms "orange light" or "orange emission" especially relate to light having a wavelength in the range of about 590-620 nm. The terms "red light" or "red emission" especially relate to light having a wavelength in the range of about 620-780 nm. The term "pink light" or "pink emission" refers to light having a blue and a red component. The terms "visible", "visible light" or "visible emission" refer to light having a wavelength in the range of about 380-780 nm.

Even more especially, the CIE coordinates of the blue LED package light is in the range of about 0.091-0.175 for the x-CIE coordinate, and in the range of about 0.025-0.183 for the y-CIE coordinate. Yet even more especially, the CIE coordinates of the blue LED package light is within a part of the CIE diagram defined by about (0.091, 0.133), (0.149, 0.025), (0.175, 0.098) and (0.174, 0.183). This substantially complies with the above indicated CIE S 004/E-2001 and/or DIN 6163-4:2011-07. By choosing the dominant wavelength (or peak wavelength) of the light source, the type of luminescent material (including the concentration of the active species such as divalent europium and/or trivalent cerium), the type of blue pigment, as well as the relative amounts and relative configuration of the luminescent material and the blue pigment, the desired color point may be selected. Yet even more especially, the x-CIE coordinate of the blue LED package light is at maximum about 0.175 and/or the y-CIE coordinate of the blue LED package light is at minimum about 0.140; especially both conditions apply. With such CIE coordinate values the light is still blue and has substantially a maximum luminous flux. For the CIE coordinates, it is herein referred to the "CIE 1931 RGB color space" also indicated as "CIE 1931 XYZ color space" created by the International Commission on Illumination (CIE) in 1931, as known to the person skilled in the art.

Especially, the luminescent material is configured to provide a broad band emission (i.e. not line emission, such as 4f transitions of trivalent lanthanides). Hence, especially the luminscent material is based on divalent europium and/or trivalent cerium, though organic luminescent materials may also be applied (see further also below).

In a specific embodiment, the luminescent material is configured to provide luminescent material light having a peak wavelength selected from the range of 490-580 nm and/or having a full width half maximum (FWHM) selected from the range of 50-150 nm. Especially, the luminescent material is configured to provide luminescent material light having a peak wavelength selected from the range of 490-530 nm. Hence, the luminescent material may only provide green light, but may optionally in addition also provide e.g. one or more of yellow, orange and red light. In view of efficiency, especially a luminescent material is selected that provides emission having a peak wavelength selected from the range of 490-530 nm and having said FWHM in the range of 50-150 nm. Light other than green light may be partly absorbed or even be substantially absorbed by the blue pigment (see also below).

Hence, the green luminescent material is especially used to provide light having a color point that is not on the monochromacity locus, as the light source, especially the solid state light source, provides light having a color point on or relatively close to the monochromacity locus, and the luminescent material induces that the resulting color point shifts to the green (relative to the substantially monochromatic light source light). The blue pigment is used to push the resultant color back to a more desired blue, while removing at least part of the green (and optionally also yellow, orange and red, if any).

As indicated above, especially the luminescent material is based on divalent europium and/or trivalent cerium, though organic luminescent materials (such as lumogen yellow or lumogen green, etc. from BASF) may also be applied (see further also below). The term "luminescent material" may also refer to a plurality of different luminescent materials.

Each of the luminescent materials are configured to provide luminescent material comprising green light, even more especially luminescent material light having a peak wavelength selected from the range of 490-580 nm and/or having a full width half maximum (FWHM) selected from the range of 50-150 nm. Especially, each of the luminescent materials (when more than one type of luminescent material is available) is configured to provide luminescent material light having a peak wavelength selected from the range of 490-530 nm. Hence, in embodiments the dominant wavelength of the luminescent material light may especially be in one of these afore-mentioned ranges. Therefore, the luminescent material is especially configured to provide luminescent material light which is essentially green light.

In a specific embodiment, the luminescent material comprises a cerium doped garnet. Especially such luminescent material may provide green light close enough to the blue part of the spectral region, while on the other hand the amount of emission light having a color that is filtered away by the pigment may be relatively low, thereby providing an efficient LED package. Especially desired cerium doped garnets are garnets having a peak wavelength at a wavelength smaller than of the pure $Y_3Al_5O_{12}$:Ce garnet, as this archetype luminescent material provides relatively yellow emission with relatively low content of green (and long wavelength blue). Hence, in a further specific embodiment, the luminescent material comprises $(Lu_{(1-x)},Ce_x)_3(Al_{(1-y)}, Ga_y)_5O_{12}$, with $0.005 \leq x \leq 0.08$ and $0 \leq y \leq 0.7$, even more especially $0.01 \leq x \leq 0.04$ and $0.1 \leq y \leq 0.4$. Nevertheless, minor amounts of Y and/or Gd and/or Tb may also be available (instead of part of the Lu elements). Alternatively or additionally, also minor amounts of Sc may be available (instead of part of Al and/or Ga). Further, optionally some of the B—O combinations may be replaced by Si—N combinations (herein B represents one or more of Al and Ga), as known in the art.

Not only trivalent cerium based luminescent materials may be applied as luminescent material, also e.g. divalent europium based luminescent materials may be applied as green luminescent material. In a specific embodiment, the luminescent material comprises one or more of (a) $Si_{(6-x)}Al_xO_yN_{(6-y)}$:Eu wherein $0<x \leq 4.2$, $0 \leq y \leq 4.2$ (beta sialon), (b) an alkaline earth metal orthosilicate doped with europium, (c) $BaMgAl_{10}O_{17}$:Eu,Mn, (d) $BaMg_2Al_{16}O_{27}$:Eu,Mn, and (e) $Sr_4Al_{14}O_{25}$:Eu. Further also luminescent materials as defined in WO 2002/054502 may be applied.

The blue pigment is especially configured to absorb part of the green luminescent light from the luminescent material. Hence, the blue pigment is especially configured to have a substantially larger transmission in the blue than in the yellow, orange or red. The transmission in the green may e.g. be between the transmission in the blue and the transmission in the yellow, orange or red. Hence, within the visible, the blue pigment may especially have maximum absorption(s) in the range of 570-640 nm. Especially, the blue pigment has a mean absorption in the range of 495-530 nm that is substantially smaller than a mean absorption in the range of 530-680 nm. Even more especially, the blue pigment has a mean absorption in the range of 495-530 nm that is substantially smaller than a mean absorption in the range of 530-630 nm. The term "substantially" in this context may e.g. include a difference of at least a factor of 2, such as at least a factor of 5, like at least a factor of 10. The term "mean absorption" is especially defined as the wavelength averaged absorption (over the indicated wavelength).

The blue pigment may be an organic pigment or an inorganic pigment. The term "pigment" may also refer to a plurality of different pigments. In an embodiment, the blue pigment comprises an organic dye having a color index international number (CI number) selected from the range of 42,000-45,000. Examples of suitable pigments may include one or more of Victoria blue 4R (Basic blue 8) with CI=42563, Victoria blue B (Basic blue 26) with CI=44045; Victoria blue R (Basic blue 11) with CI=44040, and Xylene cyanol FF (Acid blue 147) with CI=42135. Especially, these pigments appear to have the right properties in terms of absorption and stability. Alternatively or additionally, in an embodiment the blue pigment comprises phthalocyanine.

As indicated above, the pigment may also additionally or alternatively comprise an inorganic material. Hence, in yet a further specific embodiment, the blue pigment comprises one or more of (a) $MAl_2O_4$, wherein M comprises one or more of Co, Ni, Mg, Cu and Zn, wherein M at least comprises Co, and (b) $Na_xAl_6Si_6O_{24}S_y$, wherein $6 \leq x \leq 8$ and $2 \leq y \leq 4$. In the embodiment of $MAl_2O_4$, M may especially essentially comprise Co (cobalt). The latter pigment is in embodiments also indicated as "Sicopal blue".

The light source, luminescent material, and pigment may be arranged in different ways, however especially under the condition that the resulting package light comprises the blue light source light, as well as that part of the luminescent material light is absorbed by the pigment. The resulting package light thus especially comprises the blue light source light and part of the luminescent material light.

A pigment is especially a material that changes the color of reflected or transmitted light as the result of wavelength-selective absorption. This (physical) process differs from fluorescence, phosphorescence, and other forms of luminescence, in which a material emits light.

The luminescent material may be configured for instance as luminescent material comprising layer on a light source, such as on an LED die. However, the luminescent material may also be configured as luminescent material comprising layer at a distance from the light source ("remote"). Further, the pigment may be configured as pigment comprising layer downstream from the luminescent material comprising layer, either on such luminescent material comprising layer or at a distance from the luminescent material comprising layer (remote). Alternatively or additionally, the pigment and luminescent material may be comprised by the same layer, either configured directly downstream from the light source (and/) or remote from the light source. Hence, in a specific embodiment the LED package as defined herein comprises a first layer comprising said luminescent material ("luminescent material comprising layer"), and a second layer comprising said blue pigment, wherein relative to the solid state light source the second layer is configured downstream of the first layer. In yet a further embodiment, the LED package as defined herein comprises a first layer comprising said luminescent material and said blue pigment ("luminescent material comprising layer").

In yet a further aspect, the invention also provides a lighting device comprising the LED package. Such lighting device may comprise also one or more other light sources (such as one or more being configured to generate one or more of green light, yellow light, orange light, and red light). However, alternatively or additionally, such lighting device may also comprise optics, e.g. to collimate the LED package light. Of course, such lighting device may also include a control unit, configured to control the LED package (light). Hence, in an embodiment the invention provides a lighting device comprising the LED package as defined herein, and a control unit, and especially also one or more of (a) optics, and (b) a further light source, wherein the control unit is configured to control the LED package and the optional further light source. Hence, in an embodiment the lighting device may provide substantially only blue light, whereas in a further embodiment the lighting device may e.g. especially be configured to provide white light, etc. As indicated above, the lighting device may amongst others be used for providing blue emergency lighting and/or for providing decorative lighting. The term "further light source" may also refer to a plurality of (different) light sources.

The LED package or lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, green house lighting systems, horticulture lighting, etc.

The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily on scale.

DETAILED DESCRIPTION OF THE EMBODIMENTS

Figure 1A:
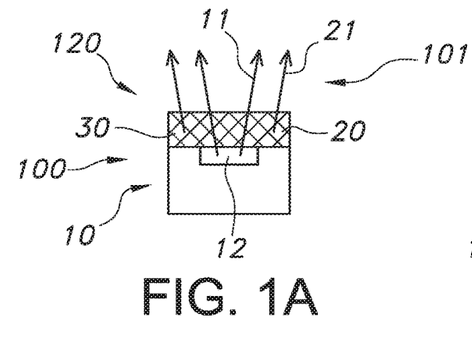
FIGS. 1a-1d schematically depicts some embodiments of the LED packages.

FIG. 1a schematically depicts an embodiment of an LED package 100 configured to generate blue LED package light 101. The LED package comprises a light source 10 configured to generate blue light source light 11, a luminescent material 20 configured to convert part of the light source light 11 into luminescent material light 21 comprising green light, and a blue pigment 30 configured to absorb part of the luminescent material light 21. In this schematic embodiment, the luminescent material 20 and the pigment 30 are comprised in a single layer, indicated as first layer 120. As solid state light source is applied in this embodiment, which includes an LED die 12. The luminescent material layer, or luminescent material comprising layer, or first layer 120, is in this schematic embodiment in physical contact with the LED die.

Figure 1B:
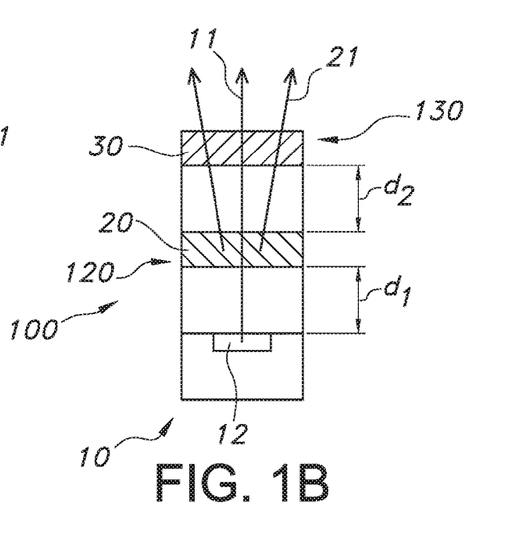
Figure 1C:
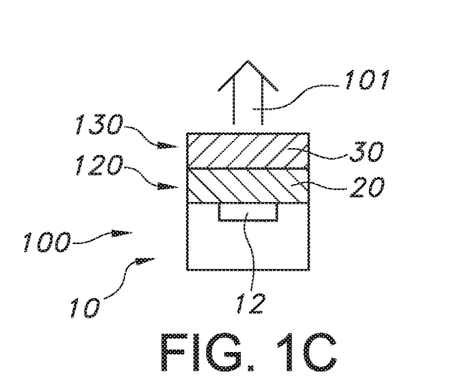
Figure 1D:
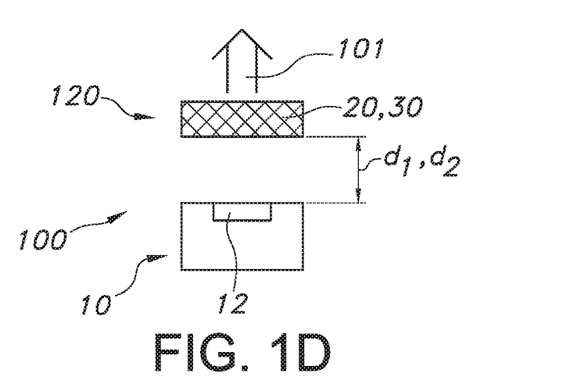

FIGS. 1b-1d schematically depicts some variants, with a non-zero distance d1 between the first layer 120, comprising said luminescent material 20 (see FIGS. 1b and 1c), or also being in physical contact with the light source, especially the LED die 12 (FIG. 1c). Further, the pigment 30 may also be at a non-zero distance d2 from the luminescent material, as schematically depicted in FIG. 1b. In FIG. 1c, the luminescent material (comprising layer 120) is configured directly downstream from the light source and the pigment 30 is configured directly downstream from the luminescent material comprising layer 120. FIG. 1d is substantially the same embodiment as schematically depicted in FIG. 1a, with the exception that the luminescent material 20 and the pigment 30 are configured at a non-zero distance d1 from the light emitting surface, here the LED die 12, of the light source 10.

Figure 2:
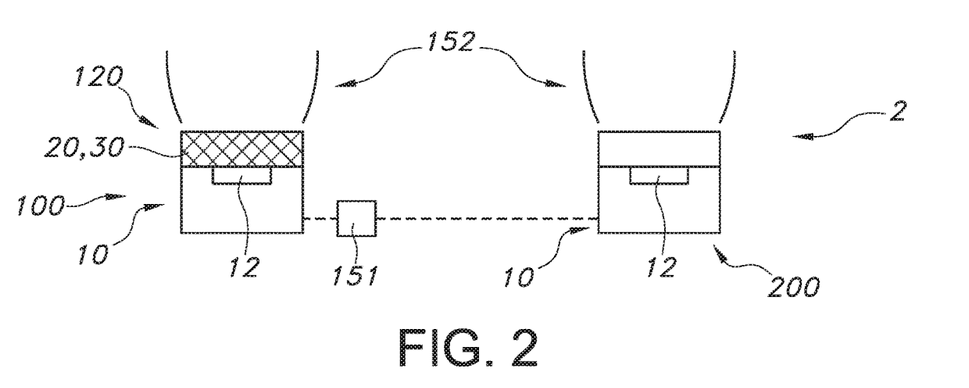
FIG. 2 schematically depicts an embodiment of a lighting device.

FIG. 2 very schematically depicts an embodiment of a lighting device 2 comprising the LED package 100 and a control unit 151. The lighting device 2 may further optionally comprise one or more of (a) optics 152, and (b) a further light source 200. The control unit 151 may especially be configured to control the LED package 100 and the optional further light source 200. By way of example, the further light source 200 also comprises a LED light source. Further, by way of example downstream from this further light source 200 also optics have been arranged. Of course, instead of individual optics, or in addition to individual optics, downstream of the LED package 100 and the further light source 200, also optics may be arranged.

Figure 3A:
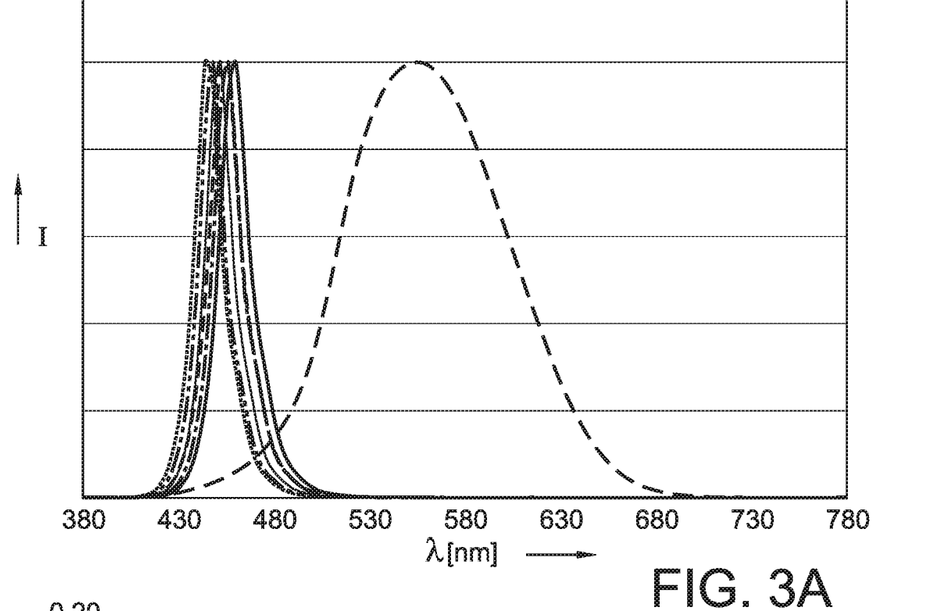
FIG. 3a shows a normalized emission spectrum of blue InGaN LEDs with dominant wavelength of 450 to 465 nm (full lines) and the luminous efficiency function (dashed curve) for Photopic viewing according to CIE 1931.

FIG. 3a shows emission spectra of blue LEDs (InGaN) (see also FIG. 3b) in combination with the luminosity function of the human eye sensitivity (dashed curve). Although blue InGaN LEDs are very efficient for conversion of electrical into optical power, the perceived brightness for the emitted blue light is low due to the limited eye sensitivity of the human visual system.

Figure 3B:
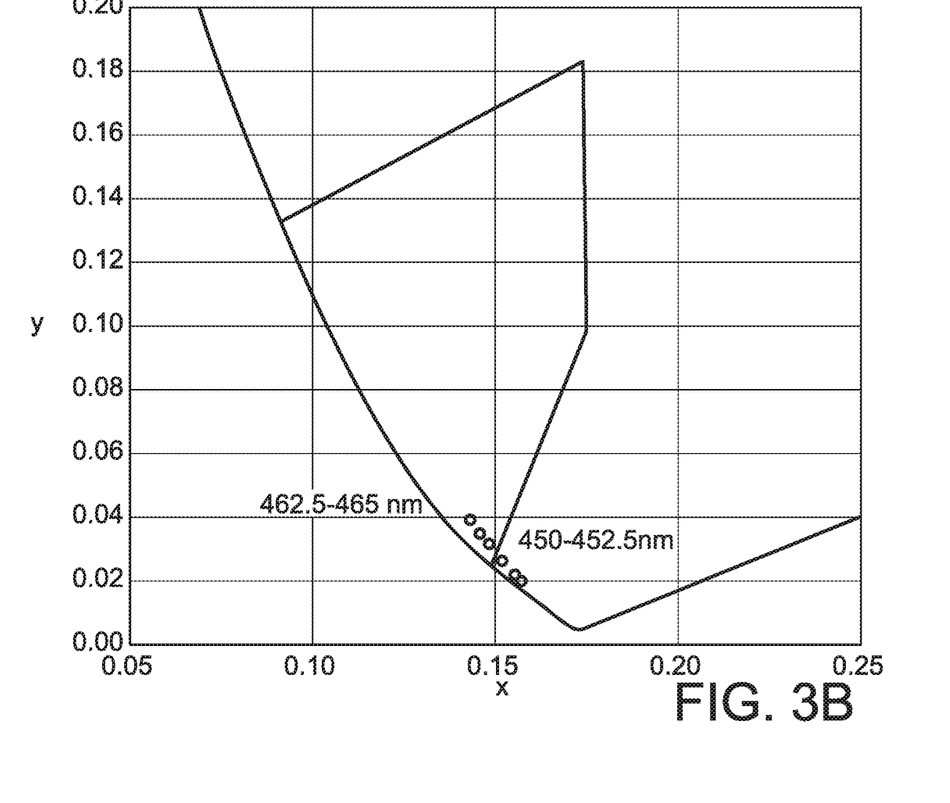
FIG. 3b shows the CIE 1931 chromaticity chart showing the color points of the blue LEDs of FIG. 1 and a blue color zone for saturated blue colors complying with CIE S 004/E-2001 and DIN 6163-4:2011-07 Colours of Light Signals. The outer curve shows the spectral locus for monochromatic colors.

FIG. 3b shows the color points of the blue LEDs of FIG. 3a in a CIE chromaticity chart and a color zone for saturated blue colors. With increasing y color coordinate the lumen flux of an (LED) emission spectrum with identical optical power increases rapidly. This could also be realized by shifting the blue InGaN emission to higher wavelength, but this would result in a deterioration of the LED optical properties and efficiency.

Adding a green emitting phosphor material on the blue LED to convert a fraction of blue light increases luminous flux, but the flux increase is limited because the blue color zone of FIG. 3b is rapidly left, due to the spectral properties of efficient green emitting LED phosphors.

Hence, the invention provides a blue light emitting LED with high luminous flux with especially a color point within a color zones of saturated blue light and especially compatible with e.g. CIE S 004/E-2001 Colours of Light Signals. It is another object of the invention to keep the color point within the blue color zone for all temperatures and driving conditions of the LED.

It is another intention of the invention to produce LEDs having a highest possible y-color coordinate within a blue color zone at a given x-color coordinate. This is achieved by combining a blue InGaN LED with a green emitting phosphor, converting a fraction of the blue LED light into green emission and a blue pigment. The green phosphor can be any phosphor material with a peak emission wavelength Lpk with 490 nm<Lpk<580 nm; especially the peak wavelength is in the range of 490-530 nm.

Especially, the pigments used have been selected due to their stability for high temperatures and high irradiation levels of light, which allows the application in any blue LED package. In principle, any blue pigment can be used, especially as long as it is substantially compatible with the application and reliability requirements. The pigments mentioned above are e.g. available as fine grain powders and can be mixed into silicones or other matrix materials. It is possible to add the pigment powder simply to a phosphor slurry and apply it together with the phosphor layer. Alternatively a phosphor free pigment slurry can be applied on top of a phosphor layer. The resulting optical effects on color point and flux are comparable. Also a combination with any phosphor material with desired emission properties is feasible, ranging from quantum dots over inorganic phosphor to ceramic phosphor plates to organic phosphor components (e.g. Lumogens). Hence, in an embodiment the package comprises a luminescent material comprising layer, wherein the layer especially comprises a silicone as host for the luminescent material, and optionally also for the blue pigment.

EXAMPLE 1

Figure 3C:
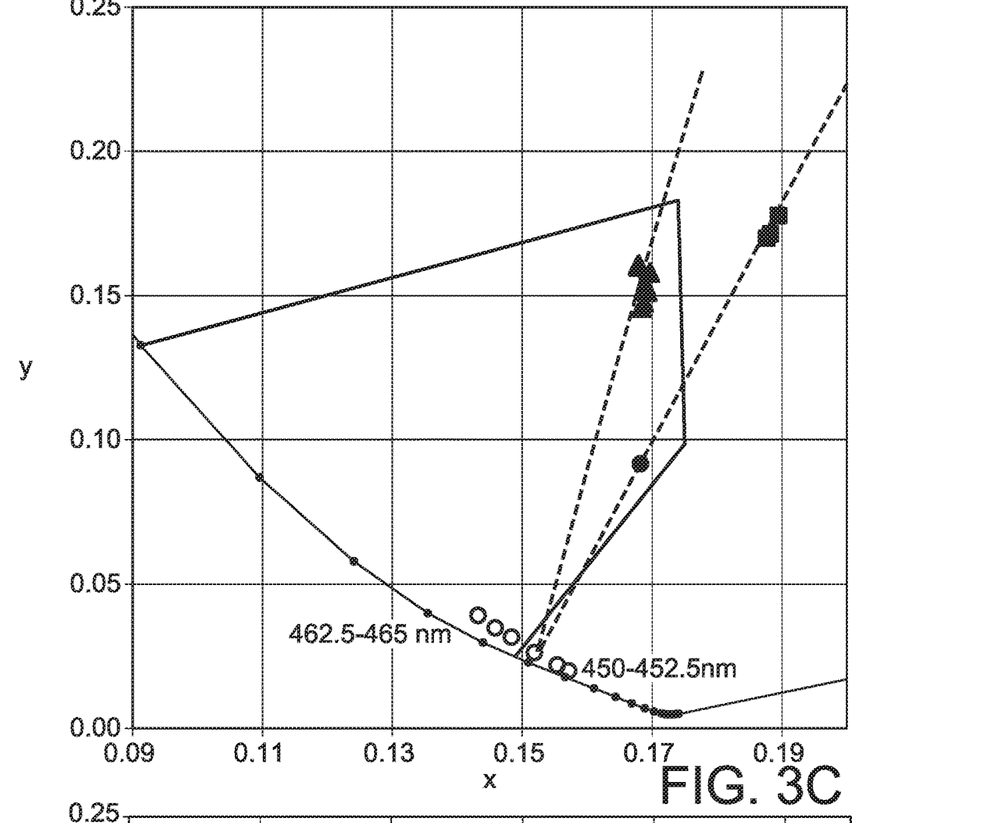
FIG. 3c shows the color points of pcLEDs made with Ga,LuAG:Ce phosphor on blue LEDs. Squares: no blue pigment, blue LED with 455.5 nm dominant wavelength. Triangles: with Sicopal pigment (steeper line, in this non-optimized example the line is nearly ending in the highest y-value of the indicated blue area)). Circle: without blue pigment for identical x color coordinate as the inventive example. The resulting flux gain for this blue LED by the application of the blue pigment is 20 percent—comparing at identical x-color coordinate (see also table 1 below)

A phosphor slurry was made by mixing 15.4 wt-% of $(Lu_{(1-x)},Ce_x)_3(Al_{(1-y)},Ga_y)_5O_{12}$ with x=0.02 and y=0.4 with 1 wt-% of Silica into silicone (all weight fraction are calculated relative to the silicone mass of the matrix material). This slurry was used to dispense midpower 3535L packages with blue emitting LEDs of 455.5 nm dominant wavelength with slurry to arrive at the color points depicted in FIG. 3c (no blue pigment: circles)). To an identical slurry 0.28 wt-% Sicopal Blau from BASF were added and LEDs were made similarly to those without the blue pigment (with blue pigment: triangles). The resulting color points are also shown in FIG. 3c. Average flux values for 100 mA LED current as measured with an integrating sphere are shown in table 1:

TABLE 1

| 5000K | Circle | Squares | Triangle |
|---|---|---|---|
| T [° C.] | | 25 | |
| If [mA] | | 100 | |
| x | 0.168 | 0.188 | 0.169 |
| y | 0.092 | 0.173 | 0.155 |
| PHIv [lm] | 17.0 | 29.9 | 20.4 |

The flux gain of the LEDs with the blue pigment is 20 percent compared to LEDs without pigment and the same green phosphor at identical x-color coordinate (see table 1).

EXAMPLE 2

Figure 3D:
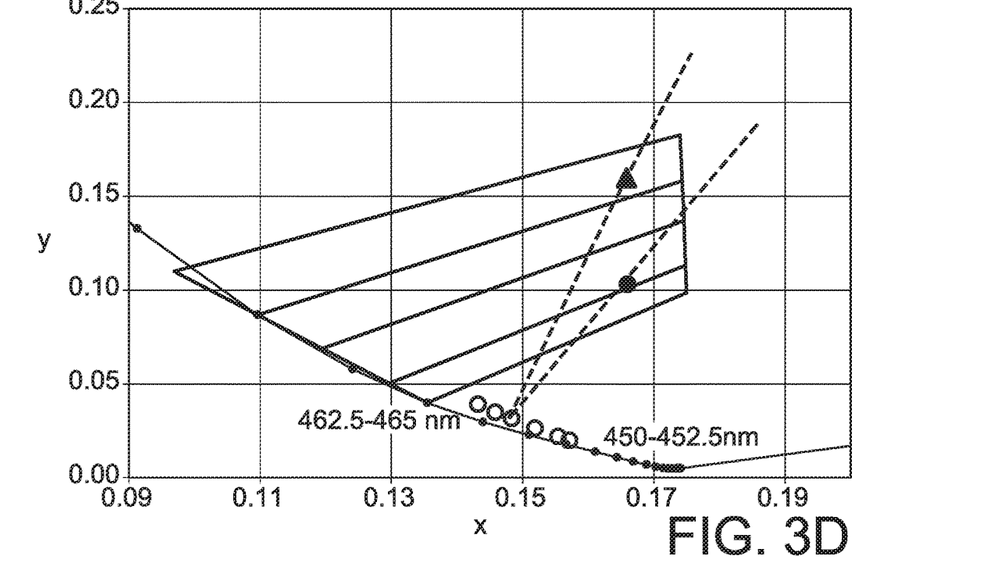
FIG. 3d shows pcLEDs made with Ga,LuAG:Ce phosphor on blue LEDs. Compared to FIG. 3c, the dominant wavelength is 458 nm. Triangles: with Sicopal pigment. Circle: without blue pigment for identical x color coordinate as the inventive example. The resulting flux gain for this blue LED by the application of the blue pigment is now 26 percent (see also table 2 below)

Now the blue wavelength of the next blue bin with longer dominant wavelength of 458 nm was used with the same phosphor slurry without pigment. Another identical phosphor slurry with 0.24 wt-% Sicopal Blau was made, and LEDs with a blue dominant wavelength of 458 nm were dispensed. Average color points are shown in FIG. 3d. For an x color coordinate of x=0.166 the flux within the blue color zone is now increased by 26 percent for the application of the blue pigment in the phosphor suspension as shown in table 2. LEDs of identical x-color coordinate have been compared.

TABLE 2

| | Circle | Triangle (inventive) |
|---|---|---|
| T [° C.] | | 25 |
| If [mA] | | 100 |
| Blue | 458 nm | 458 nm |
| x | 0.166 | 0.166 |
| y | 0.103 | 0.160 |
| PHIv [lm] | 18.6 | 23.4 |

Figure 3E:
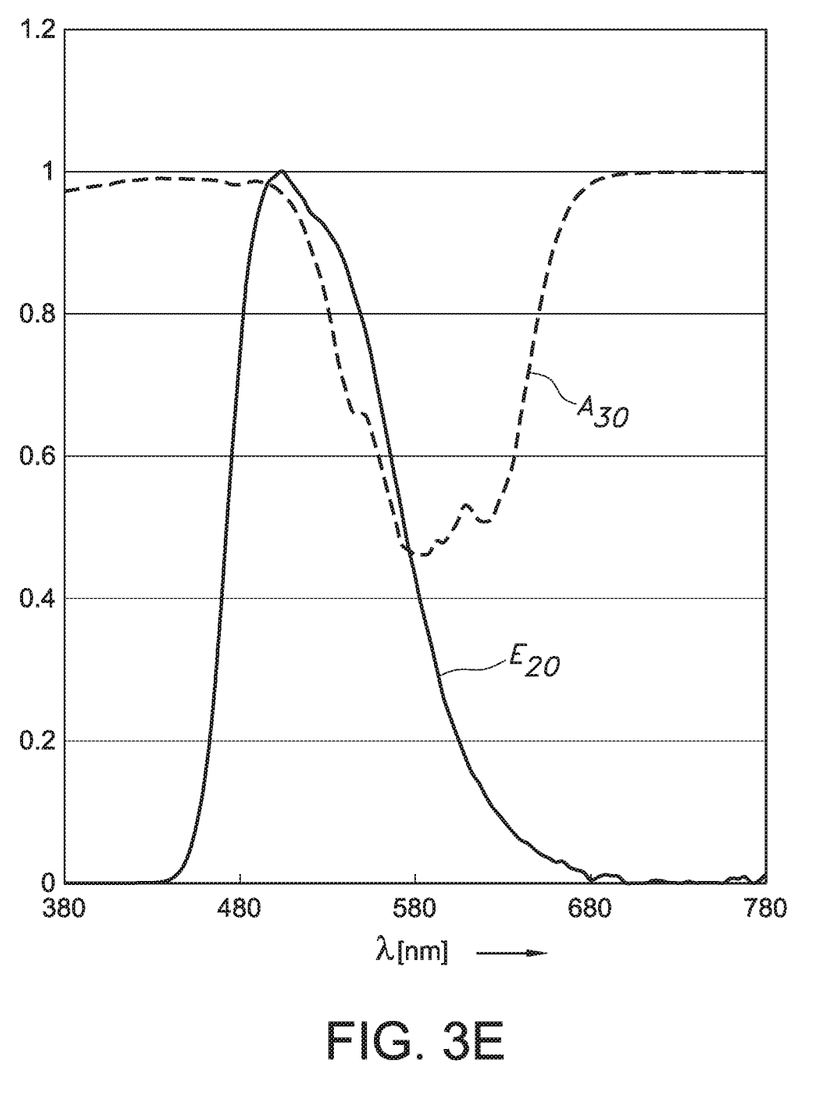
FIG. 3e shows emission of a luminescent material and the transmission of a pigment used in examples of the invention.

FIG. 3e shows the emission spectrum of the luminescent material 30 used, indicated with reference E20 and the transmission or (inverse) absorption of the pigment 30 used, indicated with reference A30. As can be seen from this graph, the pigment absorps part of the long wavelength emission of the luminescence. By way of example, the mean absorption in the wavelength range of 530-680 nm may be in the order of about 0.6-0.7 (in this example).

The term "substantially" herein, such as in "substantially all light" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

The invention claimed is:

1. A LED package configured to generate blue LED package light, wherein the LED package comprises
   a solid state light source configured to generate blue light source light,
   a luminescent material configured to convert part of the light source light into luminescent material light comprising green light, and
   a blue pigment configured to absorb part of the luminescent material light, wherein the luminescent material comprises one or more of:
   $(Lu_{(1-x)},Ce_x)_3(Al_{(1-y)},Ga_y)_5O_{12}$, with $0.005 \leq x \leq 0.08$ and $0 \leq y \leq 0.7$;
   $Si_{(6-x)}Al_xO_yN_{(6-y)}$:Eu wherein $0<x\leq4.2$, $0\leq y\leq4.2$ (beta sialon)
   an alkaline earth metal orthosilicate doped with europium;
   $BaMgAl_{10}O_{17}$:Eu,Mn;
   $BaMg_2Al_{16}O_{27}$:Eu,Mn; and
   $Sr_4Al_{14}O_{25}$:Eu.

2. The LED package according to claim 1, wherein the CIE coordinates of the blue LED package light is in the range of 0.091-0.175 for the x-CIE coordinate, and in the range of 0.025-0.183 for the y-CIE coordinate.

3. The LED package according to claim 1, wherein the CIE coordinates of the blue LED package light is within a part of the CIE diagram defined by (0.091, 0.133), (0.149, 0.025), (0.175, 0.098) and (0.174, 0.183), and wherein the x-CIE coordinate of the blue LED package light is at maximum 0.175 and wherein the y-CIE coordinate of the blue LED package light 10 is at minimum 0.140.

4. The LED package according to claim 1, wherein the solid state light source is configured to generate blue light source light having a peak wavelength in the range of 450-465 nm.

5. The LED package according to claim 1, wherein the luminescent material is configured to provide luminescent material light having a peak wavelength selected from the range of 490-530 nm and having a full width half maximum (FWHM) selected from the range of 50-150 nm.

6. The LED package according claim 1, wherein the luminescent material comprises a cerium doped garnet.

7. The LED package according to claim 1, wherein the blue pigment comprises an organic dye having a color index international number selected from the range of 42,000-45,000.

8. The LED package according to claim 1, wherein the blue pigment comprises phthalocyanine.

9. The LED package according to claim 1, wherein the blue pigment comprises one or more of (a) $MAl_2O_4$, wherein M comprises one or more of Co, Ni, Mg, Cu and Zn, wherein M at least comprises Co, and (b) $Na_xAl_6Si_6O_{24}S_y$, wherein $6 \leq x \leq 8$ and $2 \leq y \leq 4$.

10. The LED package according to claim 1, comprising a first layer comprising said luminescent material, and a second layer comprising said blue pigment, wherein relative to the solid state light source the second layer is configured downstream of the first layer.

11. The LED package according to claim 1, comprising a first layer comprising said luminescent material and said blue pigment.

12. A lighting device comprising the LED package according to claim 1, and a control unit, and one or more of (a) optics, and (b) a further light source, wherein the control unit is configured to control the LED package and the optional further light source.

13. A method comprising using the LED package according to claim 1, for providing blue emergency lighting or for providing decorative lighting.

* * * * *